United States Patent
Yamazoe et al.

(10) Patent No.: US 6,590,809 B2
(45) Date of Patent: Jul. 8, 2003

(54) NON-VOLATILE SEMICONDUCTOR MEMORY DEVICE

(75) Inventors: Takanori Yamazoe, Kokubunji (JP); Hiroshi Yoshigi, Hinode (JP); Yoshiaki Kamigaki, Takamatsu (JP); Kozo Katayama, Kokubunji (JP); Shinichi Minami, Kodaira (JP); Takeo Kanai, Kodaira (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/040,332

(22) Filed: Jan. 9, 2002

(65) Prior Publication Data

US 2002/0131299 A1 Sep. 19, 2002

(30) Foreign Application Priority Data

Mar. 16, 2001 (JP) ........................................ 2001-075367

(51) Int. Cl.$^7$ ............................................... G11C 16/04
(52) U.S. Cl. .............................. 365/185.1; 365/185.03; 365/185.21; 365/189.01
(58) Field of Search ..................... 365/185.03, 185.1, 365/189.01, 203, 148, 185.26, 185.21

(56) References Cited

U.S. PATENT DOCUMENTS 5,999,445 A * 12/1999 Rolandi et al. ......... 365/185.03
6,178,113 B1 * 2/2001 Gonzalez et al. ........... 257/316

OTHER PUBLICATIONS

"Design of CMOS VLSI," edited by Tetsuya Iizuka, 1989, p. 189.

* cited by examiner

*Primary Examiner*—David Lam
(74) *Attorney, Agent, or Firm*—Miles & Stockbridge P.C.

(57) ABSTRACT

When two bits are stored per memory cell and the two bits are written or read, writing or reading operation has to be performed twice. When a memory array is constructed by using a memory cell, by the access of twice, read time or write time twice as long as conventional read or write time is required. It causes deterioration in speed of a system using the memory. To solve the problem, according to the invention, bit arrangement of a conventional memory cell array is changed according to a writing or reading method. With the configuration, a plurality of bytes can be simultaneously written or read by a single access. In order to perform reading at higher speed, a sense amplifier requiring no precharging is also provided.

3 Claims, 16 Drawing Sheets

MEMORY GATE
EXPANSION FIGURE

WRITE

READ

CASE OF DATA IS "1"
(NON TRAPPED CHARGE)

CASE OF DATA IS "0"
(TRAPPED CHARGE)

CASE OF DATA IS "1"
(NON TRAPPED CHARGE)

CASE OF DATA IS "0"
(TRAPPED CHARGE)

CASE OF DATA IS "1"
(NON TRAPPED CHARGE)

CASE OF DATA IS "0"
(TRAPPED CHARGE)

NON-VOLATILE SEMICONDUCTOR MEMORY DEVICE

BACKGROUND OF THE INVENTION

1. Field of the Invention

The present invention relates to a semiconductor memory device and, more particularly, to a non-volatile semiconductor memory device storing 2-bit information per memory transistor.

2. Description of the Related Art

FIG. 1 shows an example of the configuration of a memory array of a conventional EEPROM (Electrically Erasable Programmable ROM). In the conventional EEPROM, as shown in FIG. 1, a unit memory cell is constructed by two transistors; a switch transistor and a memory transistor, and information of one bit is stored in the memory transistor. As for arrangement of bits, as shown in FIG. 1, bits are defined by sequentially assigning b0, b1, b2, . . . to memory cells.

FIG. 2 is a block diagram showing a one-chip microcomputer in which a CPU (Central Processor unit), a memory, and the like are mounted on a one chip. Blocks of a memory, a serial interface unit, and a parallel interface unit are connected to a CPU via an address bus and a data bus, and data is transmitted/received by using the address and data buses.

FIG. 3 is a block diagram more specifically showing the memory block in FIG. 2 as a single memory. Also in the case of seeing the memory block as a single memory, data is read/written from/to the CPU and the like via the address and data buses.

SUMMARY OF THE INVENTION

A memory cell storing information of two bits into one memory transistor has been studied by some of the inventors of the present invention. This memory cell has applied for patent under Japanese Patent Application No. 2000-83246. In the memory cell, as shown in FIG. 4, by accumulating charged in localized trapping regions at both edges in the channel direction of a nitride film sandwiched by oxide films, storage of 2-bit information to a single memory transistor is realized. As shown in FIGS. 5A and 5B, to read/write 2-bit information from/to the memory cell, a reading/writing operation is performed on the memory cell twice while interchanging the source and the drain. At the time of the reading operation, electrons are injected to a source-side edge of the nitride film. Also, a transistor is made conductive and Vth is detected. Further, an erasing operation can be performed by tunneling out the electrons trapped in the nitride film in a lump from the gate or well side. Such a memory cell has an advantage that the cell area per bit can be reduced to ½ to ⅓ of that of a conventional cell.

The inventors herein have studied the configuration of a memory array using the two bits per cell memory.

FIG. 6 is a diagram showing the configuration of a memory array in the case of applying the idea of the configuration of the conventional memory array shown in FIG. 1.

In FIG. 6, in order to read/write two-bit information from/to one memory cell, as shown in FIGS. 5A and 5B, the memory cell has to be accessed twice while interchanging the source and drain. In the case where this memory array is assembled in a memory block of a one-chip microcomputer shown in FIG. 2, for example, when the CPU reads information of one byte (b0 to b7), in the memory array configuration of FIG. 6, the CPU reads b0, b2, b4, and b6 in the first read cycle and reads b1, b3, b5, and b7 in the second read cycle. Alternately, in the memory block, a reading operation is performed twice. After reading b0 to b7, read data is transmitted to the CPU. During this period, the CPU waits until b0 to b7 become ready.

In any of the cases, the CPU needs read cycles twice as many as that of the EEPROM memory array shown in FIG. 1. In the case of using the memory array shown in FIG. 1, since only one bit is stored in one memory transistor, one byte of b0 to b7 can be simultaneously read by one read cycle of the CPU.

Also in the case where a single memory device as shown in FIG. 3 is read by the CPU, when the two-bits-per-cell memory array as shown in FIG. 6 is used, in a manner similar to the above, twice the read cycles are necessary. Such a problem occurs not only in the reading operation but also in the writing operation.

An object of the invention is to solve the problem such that reading/writing cycles of a memory using a memory cell storing two bits per cell are twice as compared with the conventional technique and to provide a peripheral control circuit using a memory array configuration capable of reducing an area.

In order to achieve the object, bit arrangement is not defined by sequentially assigning addresses to memory cells but is defined so that information can be read/written simultaneously on a plurality of bytes unit basis according to a reading/writing method.

By arranging a plurality of unit memory arrays, information of a plurality of bytes can be read/written simultaneously.

As a memory array in which a plurality of memories are arranged, to further reduce the area, the memory array is constructed by commonly using the drain or source of a unit memory. A reading method and a circuit in an even-numbered address and those in an odd-number address are made different from each other.

In the reading circuit, high speed reading is achieved by not performing conventional-type precharging.

Further, according to the purpose, reading circuits are combined, thereby optimally using the reading circuits.

The above and other objects of the invention will become apparent by the following detailed description and the appended claims with reference to the attached drawings. In the attached drawings, the same reference numeral denotes the same or similar components.

DETAILED DESCRIPTION OF THE PREFERRED EMBODIMENTS

Figure 1:
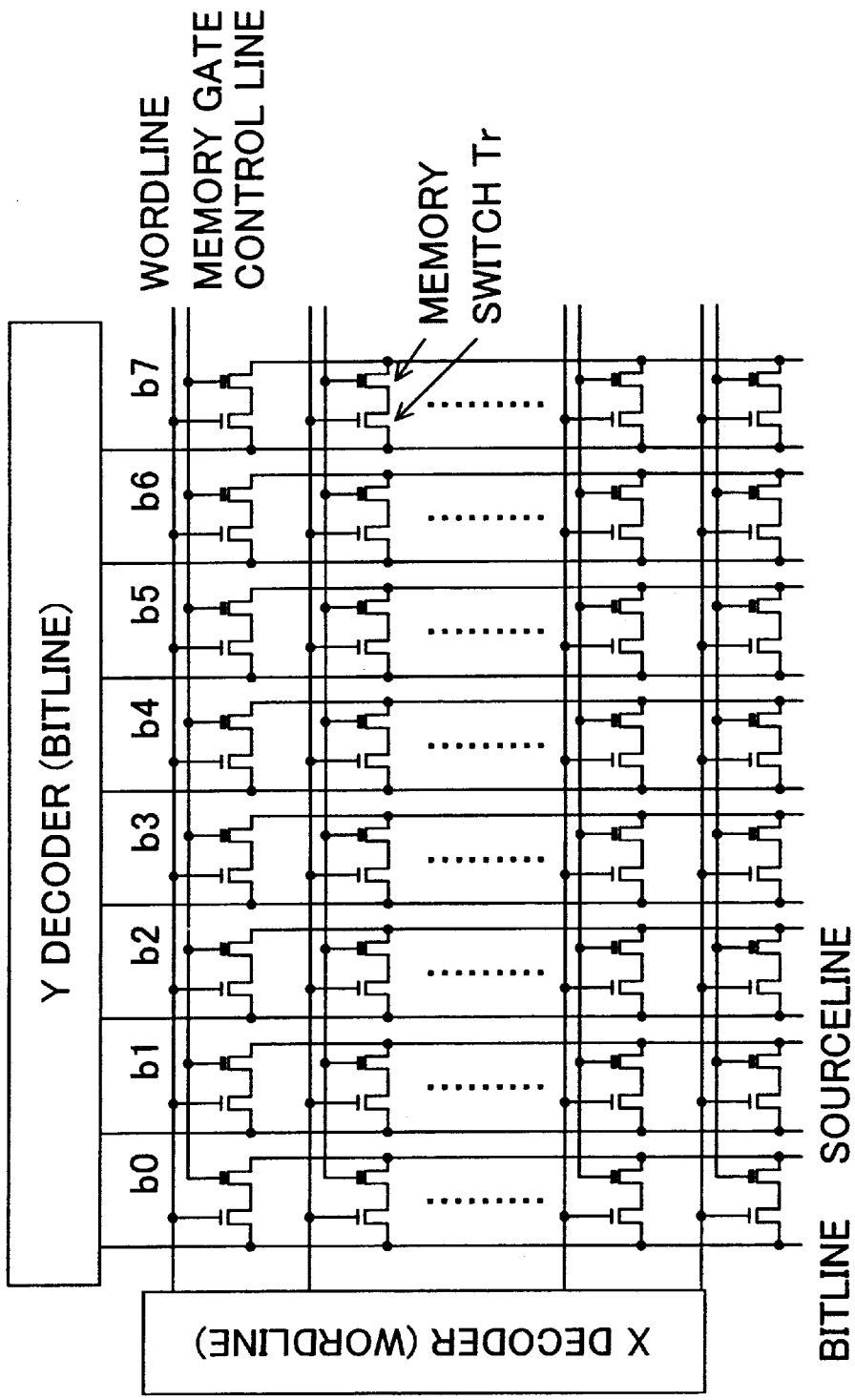
FIG. 1 is a diagram showing the configuration of an EEPROM memory array.
Figure 2:
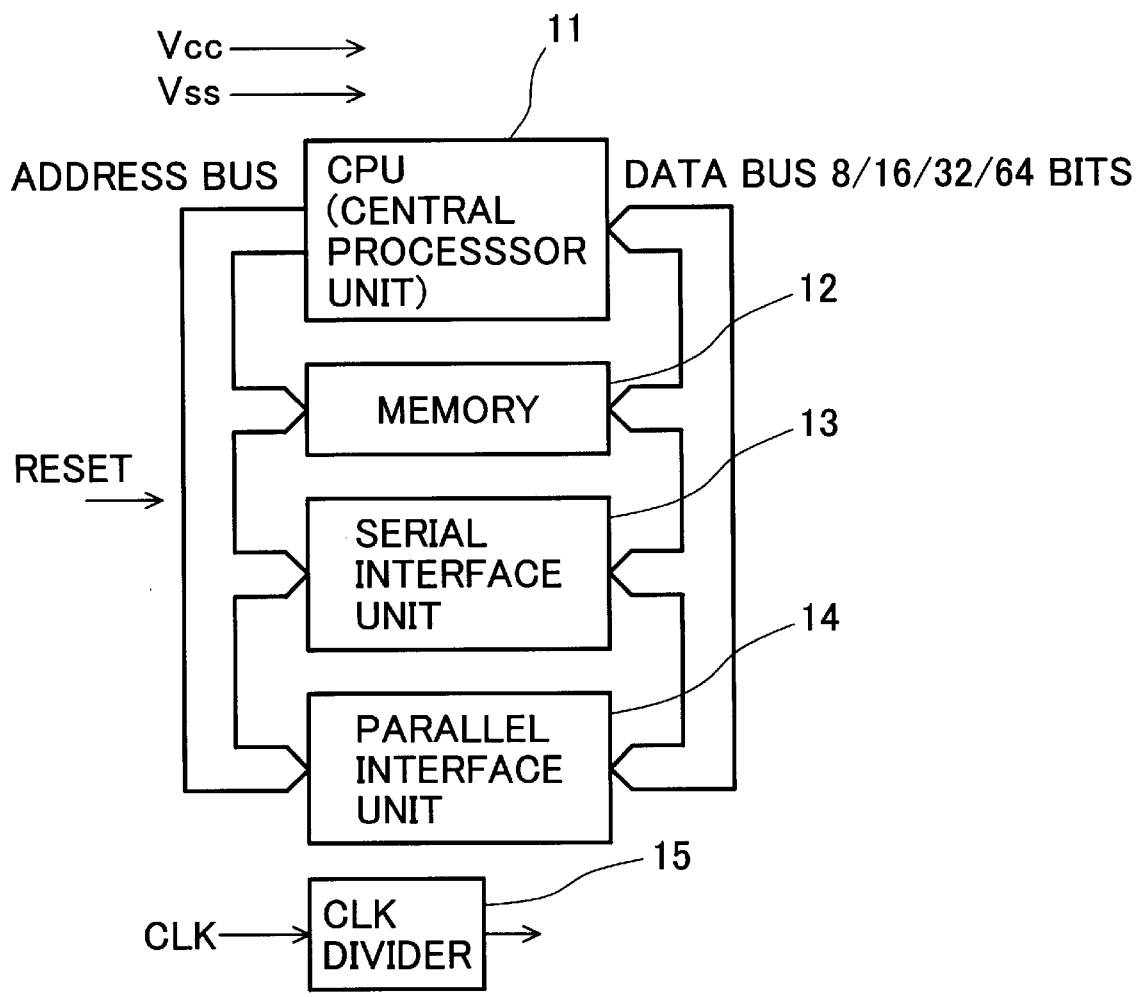
FIG. 2 is a block diagram showing a one-chip microcomputer.
Figure 3:
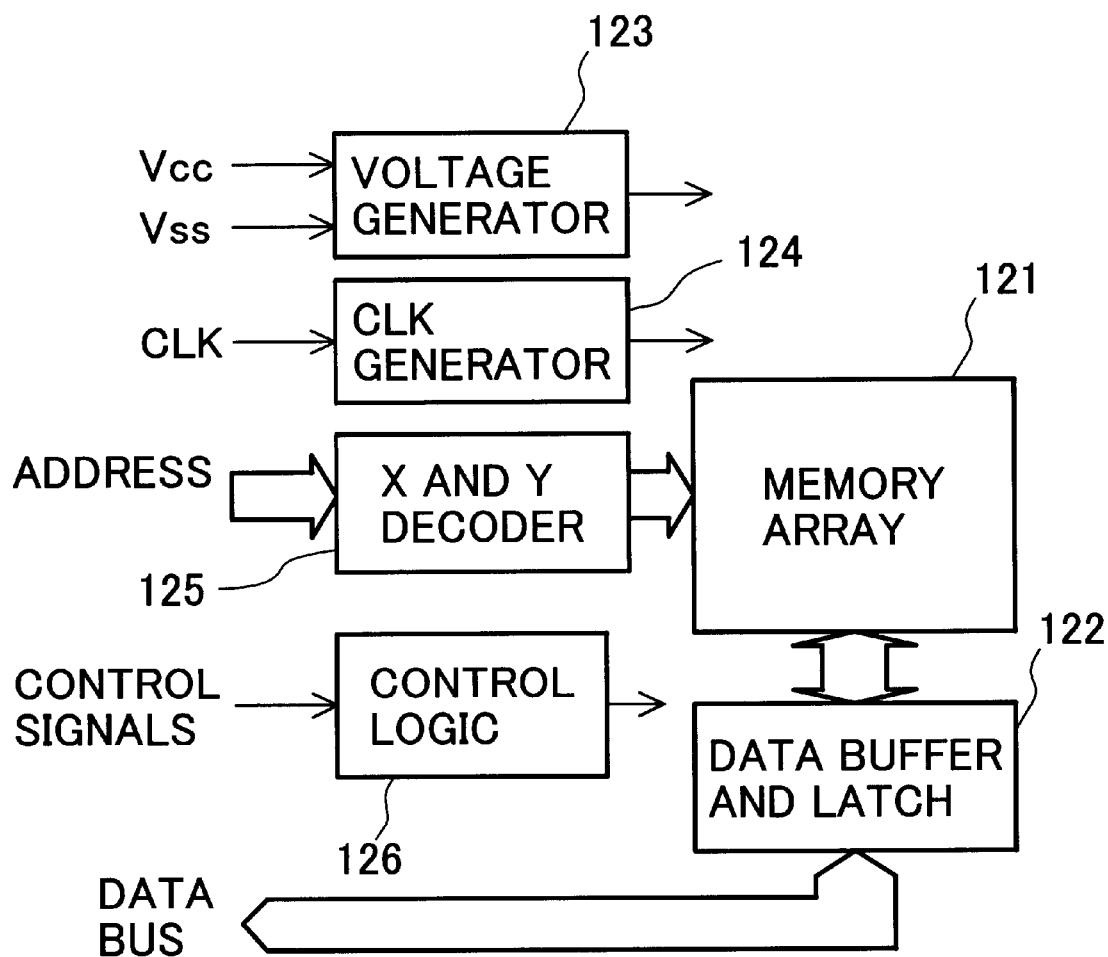
FIG. 3 is a block diagram showing a memory.
Figure 4:
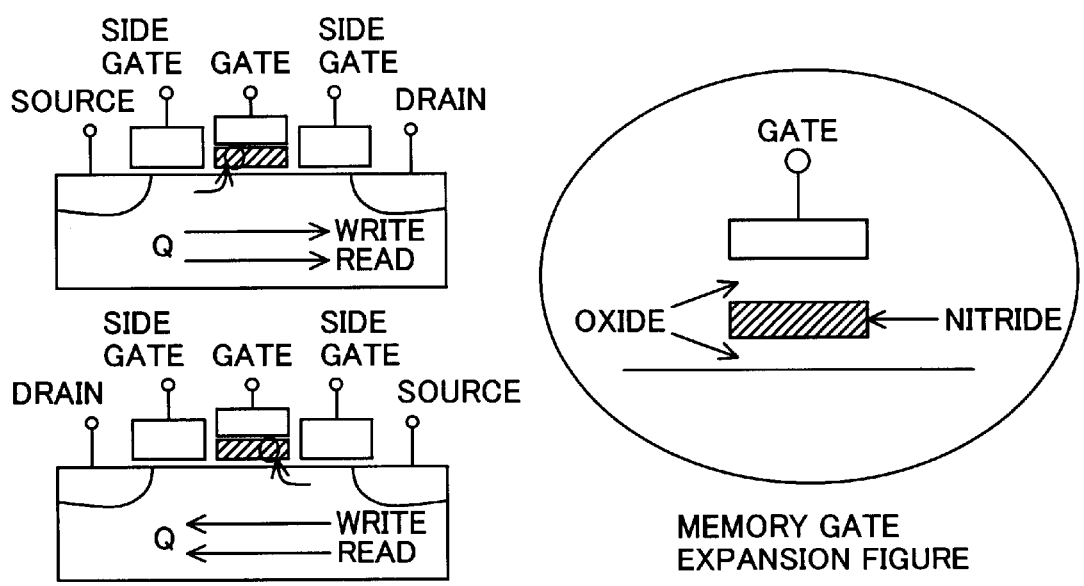
FIG. 4 is a cross section of a two-bits-per-cell memory.
Figure 5A:
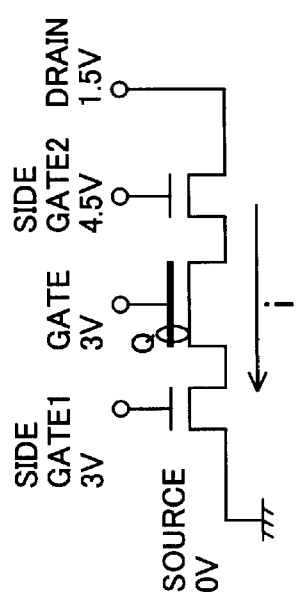
FIGS. 5A and 5B are diagrams for explaining a reading/writing method of a two-bits-per-cell memory.
Figure 5A:
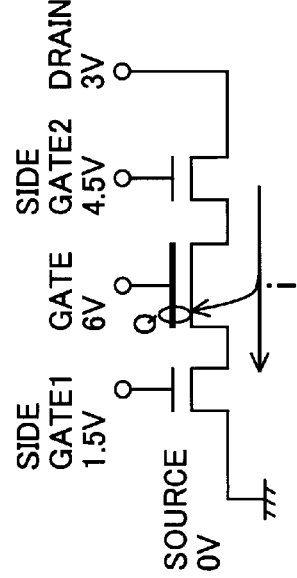
Figure 5B:
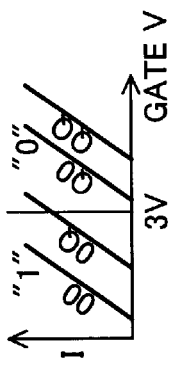
Figure 5B:
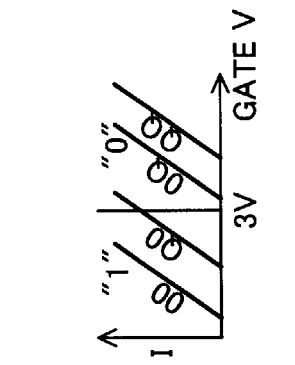
Figure 5B:
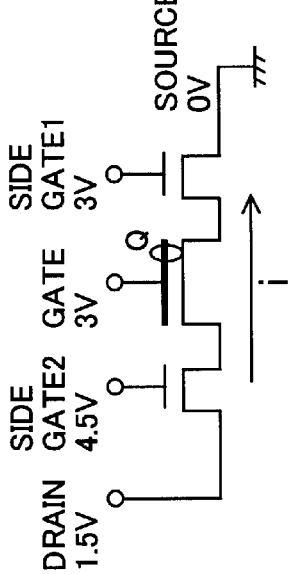
Figure 5B:
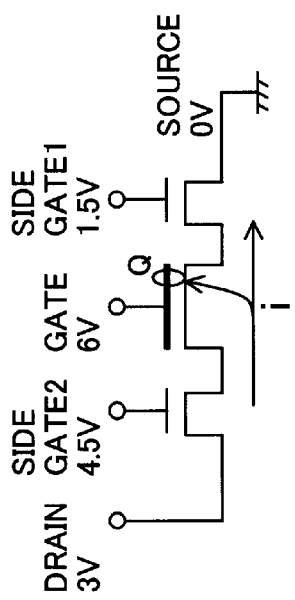

Preferred embodiments of the present invention will be described hereinbelow with reference to the drawings. The reference numerals in the drawings indicate as follows.

Figure 6:
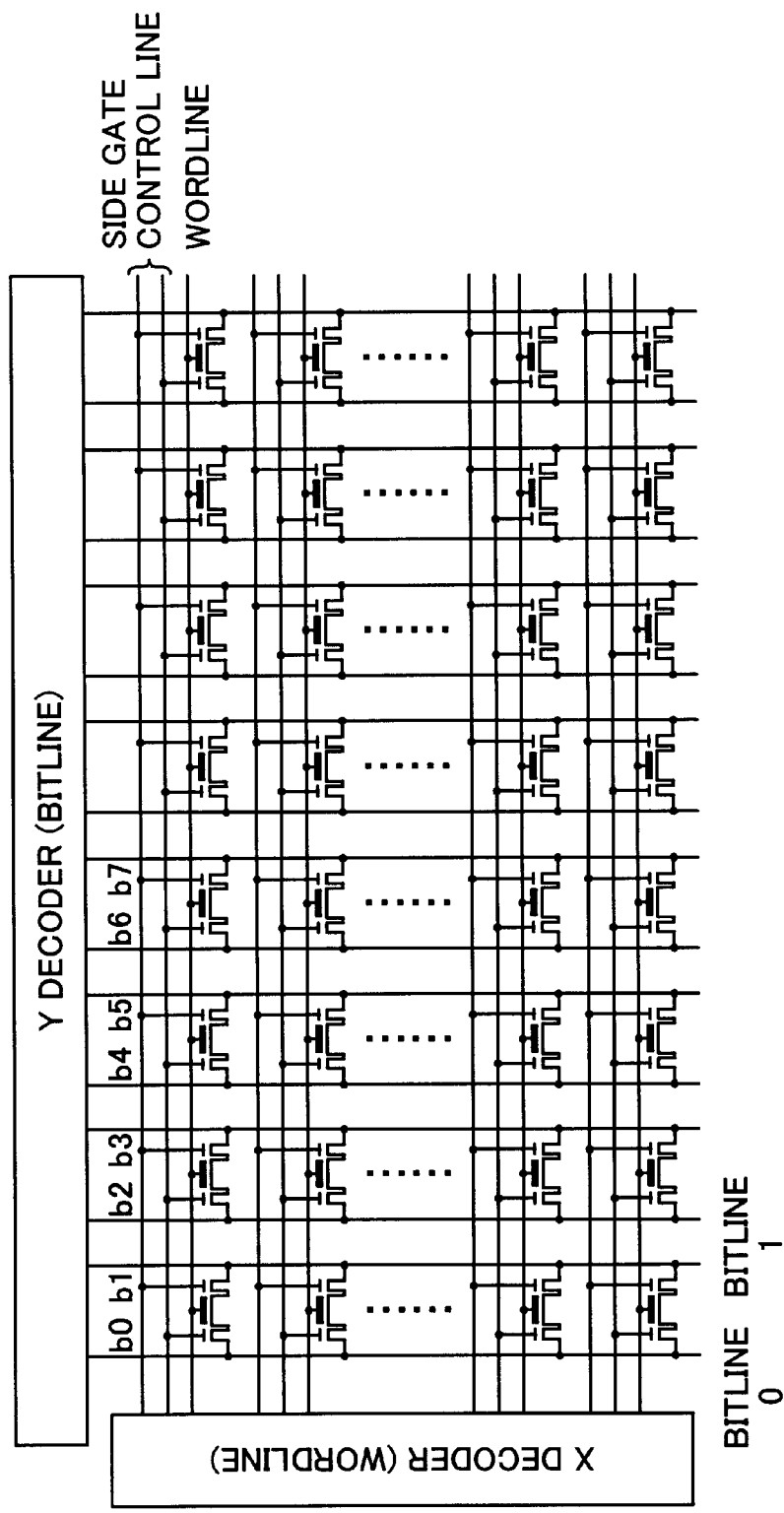
FIG. 6 is a diagram showing the configuration of a two-bits-per-cell memory array.
Figure 7:
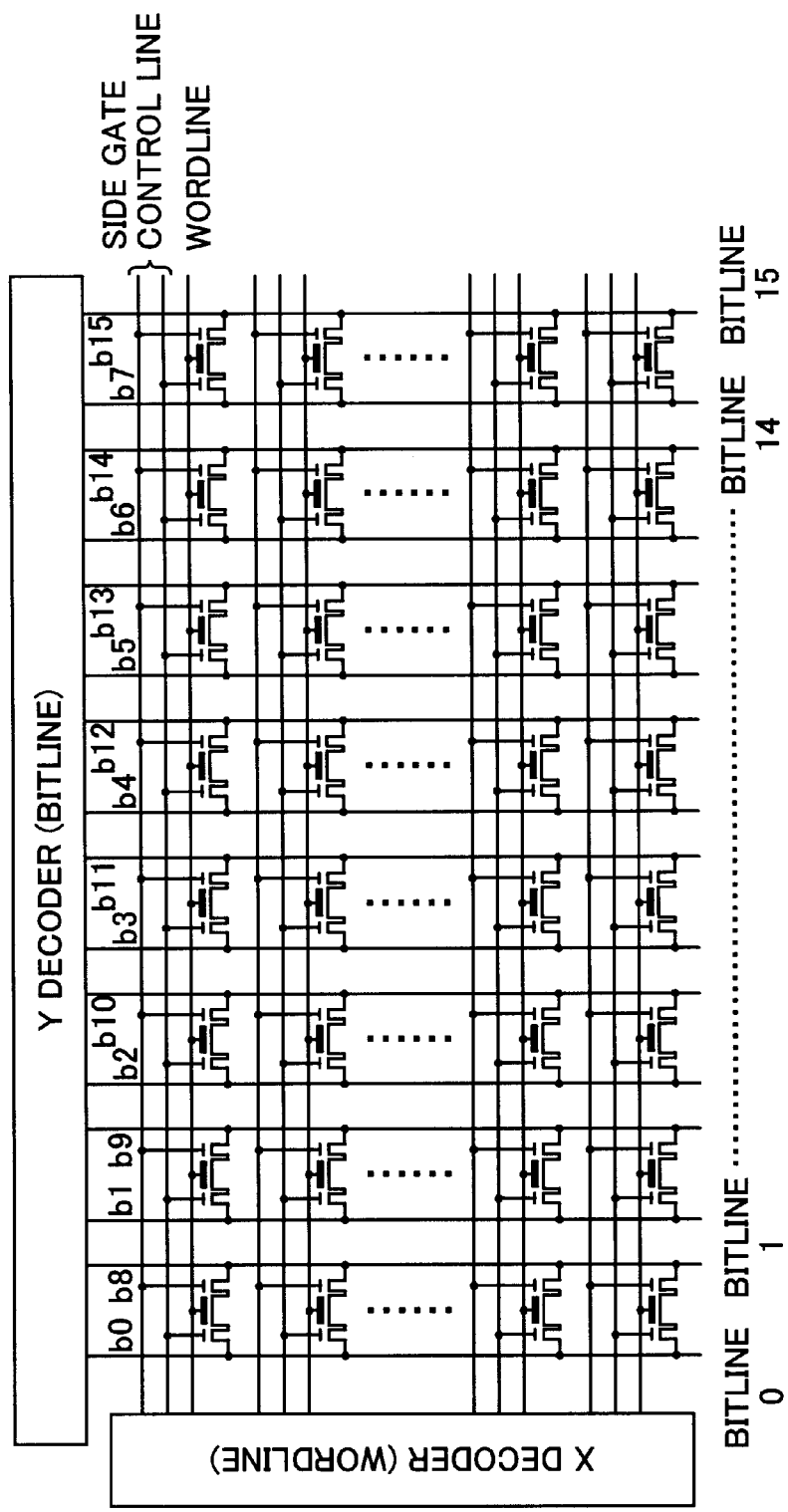
FIG. 7 is a diagram showing the configuration of a two-bits-per-cell memory array according to the invention.
Figure 8:
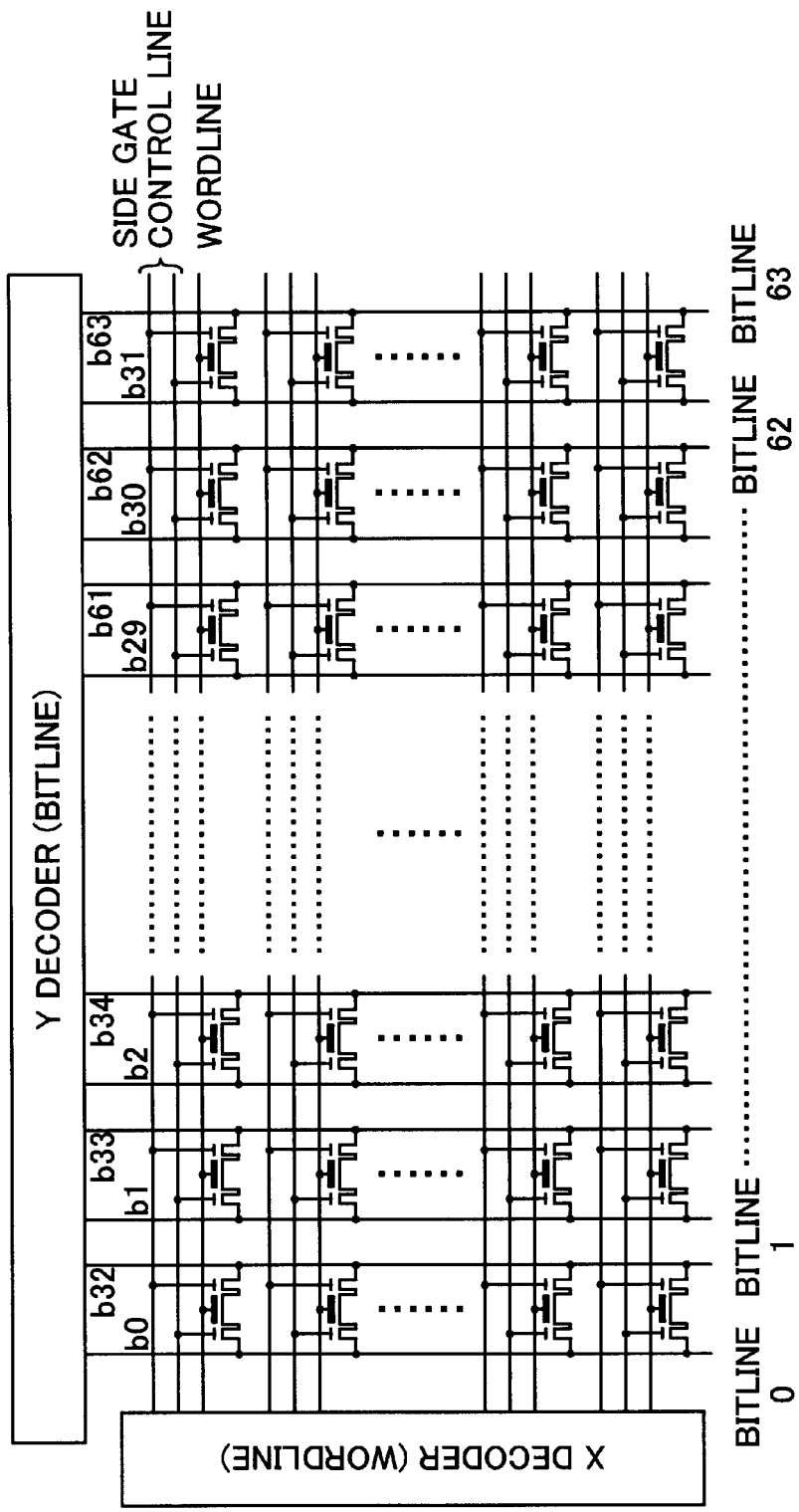
FIG. 8 is a diagram showing the configuration of a two-bits-per-cell memory array according to the invention.

11 . . . CPU
12 . . . memory
13 . . . serial interface unit
14 . . . parallel interface unit
15 . . . clock driver
121 . . . memory array
122 . . . data buffer and latch
123 . . . voltage generator
124 . . . clock generator
125 . . . X and Y decoder
126 . . . control logic
21 . . . CPU with system control & security logic
22 . . . RAM
23 . . . ROM
24 . . . EEPROM
25 . . . serial interface
26 . . . clock divider
27 . . . power supply & reset
28 . . . modem/power source FIG. 7 is a block diagram of a semiconductor memory array according to the invention. FIG. 7 is the same as FIG. 6 with respect to the configuration of the conventional memory array but is different from FIG. 6 with respect to definition of bit arrangement. By defining the arrangement of bits as shown in FIG. 7, b0 to 07 are assigned to eight memory cells. Consequently, by using bit lines 0, 2, 4, 6, 8, 10, 12, and 14 as sources and using bit lines 1, 3, 5, 7, 9, 11, 13, and 15 as drains, one byte of b0 to b7 can be simultaneously read/written. With respect to b8 to b15, by using the bit lines 0, 2, 4, 6, 8, 10, 12, and 14 as drains and using the bit lines 1, 3, 5, 7, 9, 11, 13, and 15 as sources, one byte of b8 to b15 can be simultaneously read/written. This example relates to one byte. By arranging unit memory arrays in parallel, a plurality of bytes can be simultaneously read/written. FIG. 8 shows a memory cell array and bit arrangement as an example of simultaneously reading/writing four bytes.

Figure 9:
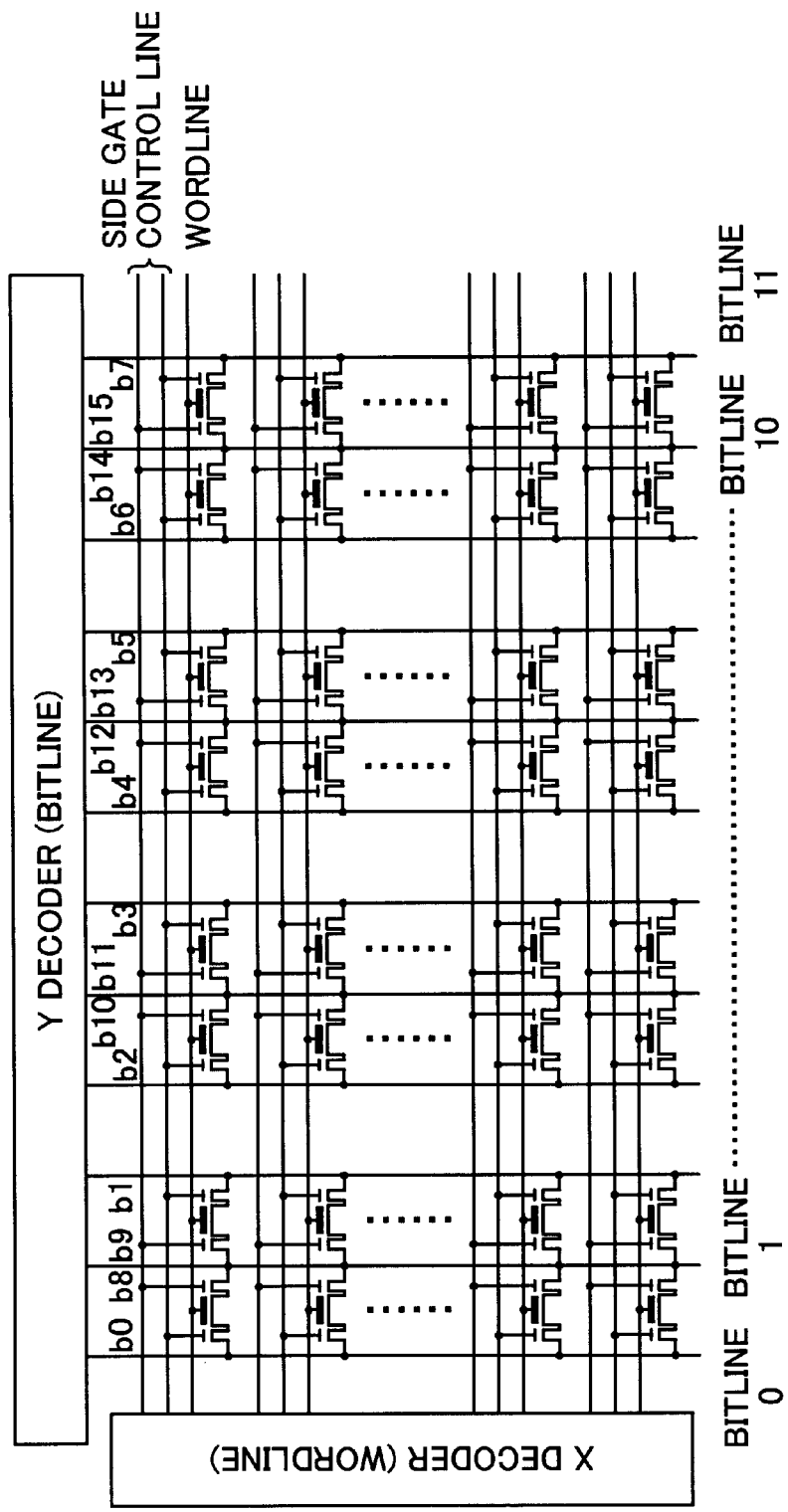
FIG. 9 is a diagram showing the configuration of a two-bits-per-cell memory array according to the invention.
Figure 10A:
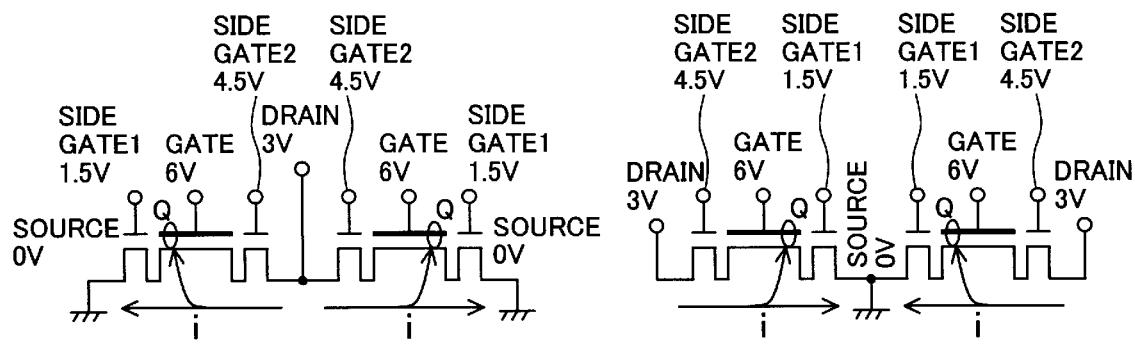
FIGS. 10A to 10C are diagrams for explaining a writing method with the configuration of the two-bits-per-cell memory array according to the invention.
Figure 10B:
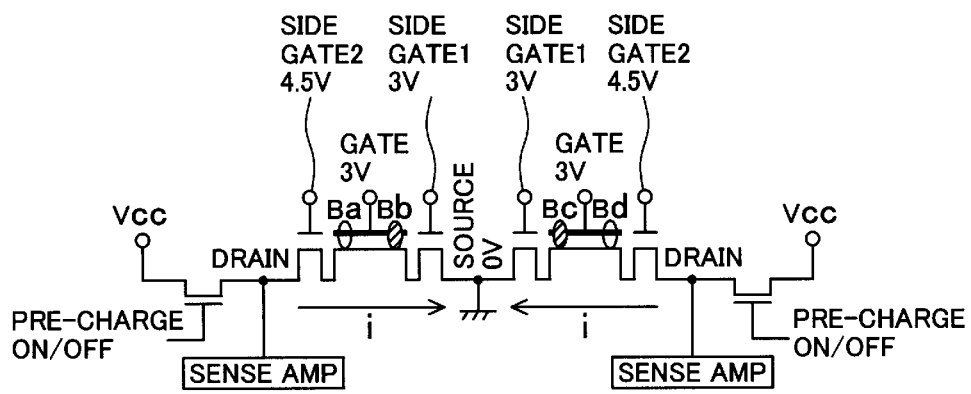
Figure 10B:
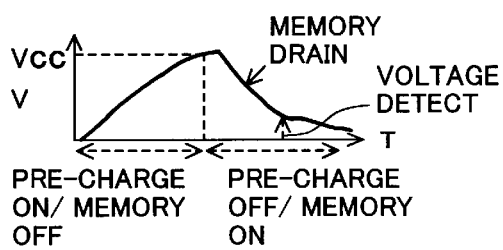
Figure 10B:
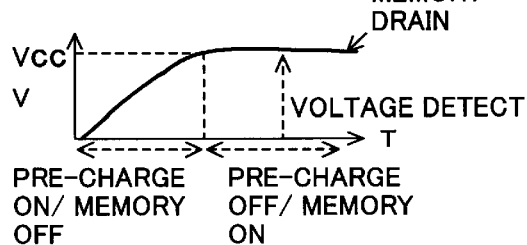
Figure 10C:
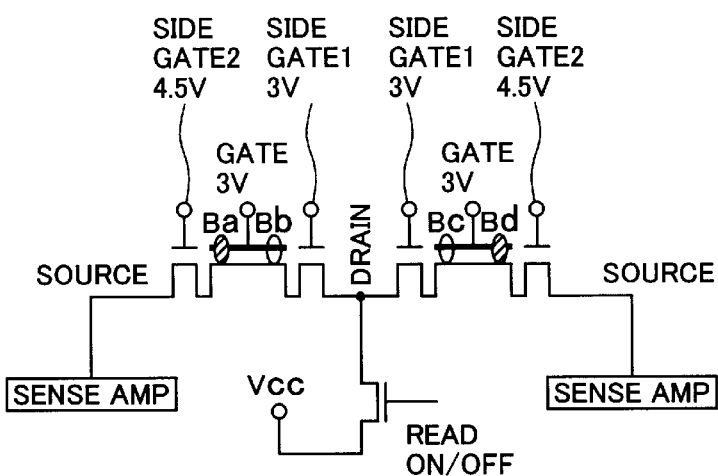
Figure 10C:
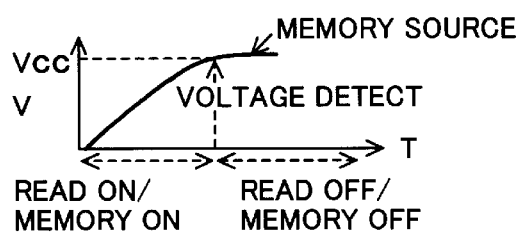
Figure 10C:
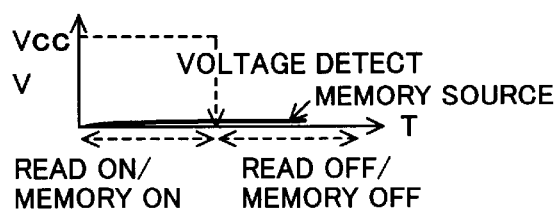

FIG. 9 shows a memory array obtained by further integrating the memory arrays of FIG. 7. In each memory, as shown in FIG. 9, two cells are connected to each other via a common bit line serving as a drain or source. By arranging a plurality of unit memory arrays each of two cells, a memory array is constructed. A method of reading/writing the unit memory array of two cells is shown in FIGS. 10A to 10C. By applying a bias and interchanging the source and drain as shown in FIG. 10A, information of four bits can be stored in two cells. At the time of reading, a sense amplifier is connected to the bit lines connected to the drain and source, threshold (Vth) of the memory cell is detected by the sense amplifier, and the information is converted to digit "0" or "1". The circuit system of the sense amplifier at the time of reading electrons (Bb, Bc) accumulated on the common bit line side and that at the time of reading electrons (Ba, Bd) accumulated on the opposite side are different from each other. To read Bb/Bc, a single end type sense amplifier system as described in literature of "Design of CMOS VLSI" edited by Tetsuya Iizuka under the supervision of Takuo Kanno, Baifukan, page 189, first edition issued in 1989 can be used. As shown in FIG. 10B, the common bit line is used as a source and 0V is set. The memory transistor is turned on by charges pre-charged on the drain side of each cell, and determination is made by whether a current is passed to the memory transistor or not. This reading method will be called a drain voltage detecting method hereinbelow.

For example, in the case where charges are not injected to Bb or Bc, when the pre-charge transistor is turned on to precharge the drain of the memory cell, the drain voltage of the memory cell increases. During this pre-charge period, the bias on the memory cell has to be stopped. After the drain voltage increases to Vcc or close to Vcc, the pre-charge transistor is turned off to stop the precharging, and the memory bias is started. Consequently, since charges have not been injected to the memory, the threshold (Vth) of the memory cell remains low, a current is passed to the memory cell, and the drain voltage decreases. The drain voltage decreased after elapse of some time since the bias was applied to the memory cell is detected as "Low". In the case where charges are injected to Bb or Bc, the threshold Vth of the memory cell is high, so that the memory cell is not turned on and a current is not passed. Thus, the drain voltage maintains at or around Vcc. Similarly, the drain voltage after elapse of some time since the bias was applied to the memory cell is detected as "High".

At the time of reading Ba/Bd, the above-described sense amplifier cannot be used for the following reason. When the drain and the source are interchanged, the common bit line becomes a drain. When the charges precharged to the drain simultaneously turns on the memory transistors of the two cells, the cell to which the current flows cannot be determined. Obviously, by turning on one of the memory transistors with time shift, the memory transistors can be read one by one. However, reading time becomes longer than that of Bb/Bc.

Consequently, although the common bit line is used as a drain at the time of reading Ba/Bd in the above manner, as shown in FIG. 10C, the source is not set to 0V but is set open. A voltage is applied to the common bit line and, simultaneously, the memory transistors of the cells are turned on. Whether the drain voltage of the common bit line appears on the source or not is detected (source voltage detecting method). In such a manner, the memory transistors of the cells are simultaneously turned on and Ba/Bd can be detected.

For example, when a read transistor is turned on and, simultaneously, a memory bias is applied, since the threshold (Vth) of the memory cell remains low, the read memory cell is turned on, Vcc is passed through the read transistor and the drain of the memory cell, and Vcc or a voltage close to Vcc appears on the source of the memory cell. Consequently, when the source voltage is detected after elapse of some time, it is detected as "High". In the case where charges are injected to Ba or Bd, the threshold Vth of the memory cell is high. Consequently, the memory cell is not turned on and the source voltage does not increase but remains around 0V. Similarly, when the bias is applied to the memory cell and, after elapse of sometime, the source voltage is detected, the source voltage is determined as "low".

By realizing the bit arrangement as shown in FIG. 9 by using the unit memory array of two cells, it becomes possible to read or write one byte with a single access. In this case, as described above, for reading even-numbered addresses b0 to b7, the source voltage detecting method is used. For reading data in the odd-numbered addresses b8 to b15, the drain voltage detecting method has to be used. The methods and circuits of the sense amplifier at the time of reading vary.

Figure 11:
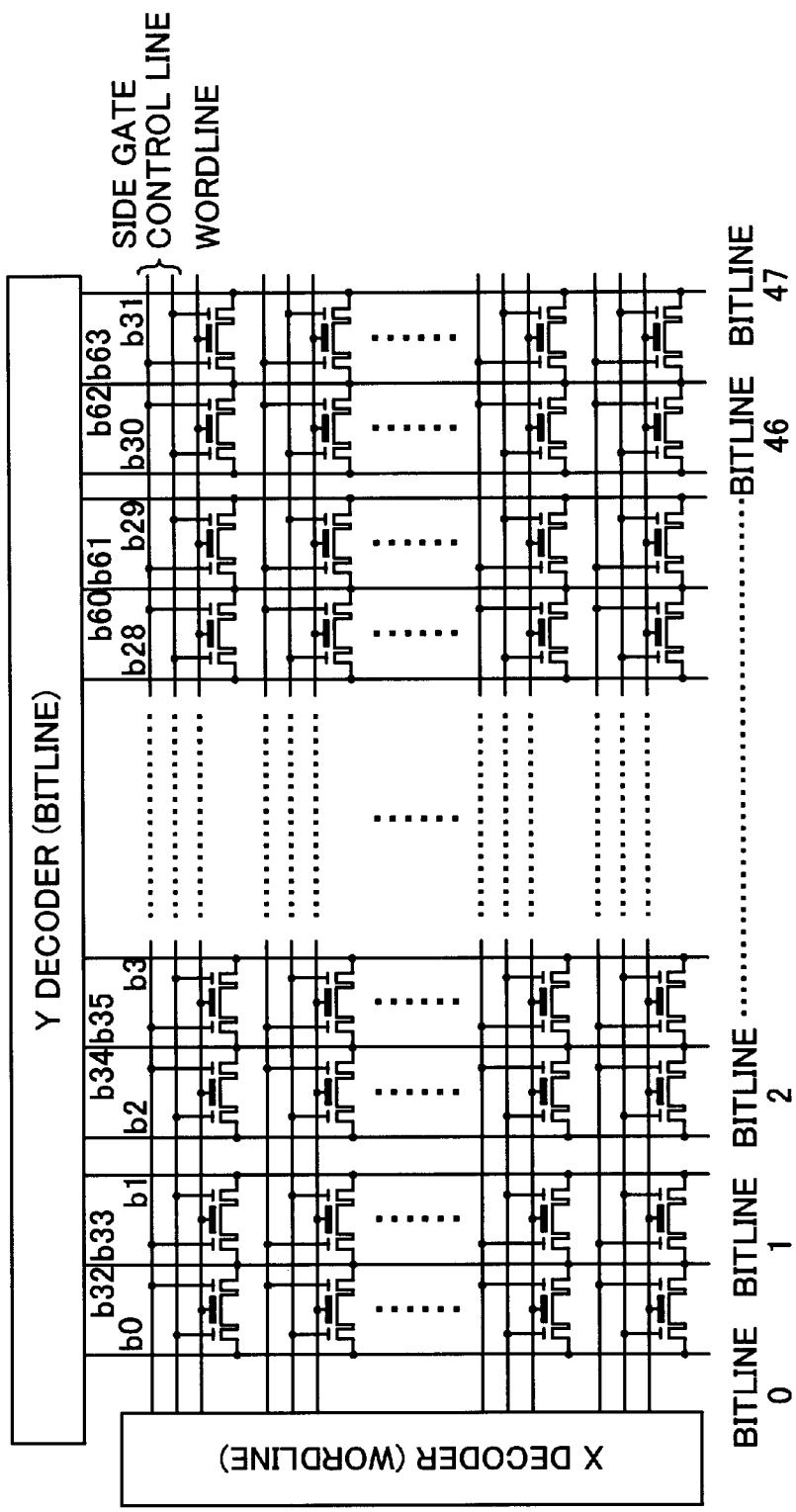
FIG. 11 is a diagram showing the configuration of a two-bits-per-cell memory array according to the invention.

This example relates to one byte. By arranging unit memory arrays each comprised of two cells in parallel, it becomes possible to read/write a plurality of bytes simultaneously. FIG. 11 shows a memory cell array and bit arrangement as an example of simultaneously reading/writing four bytes.

Figure 12:
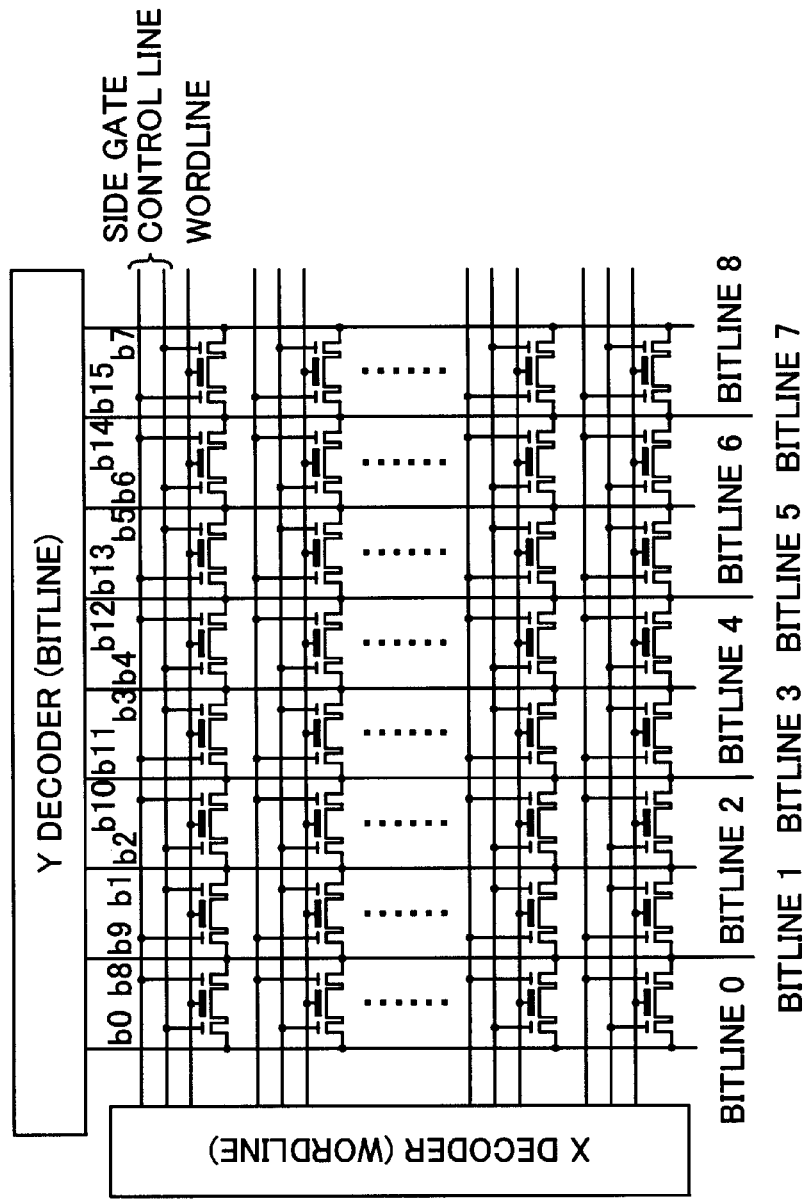
FIG. 12 is a diagram showing the configuration of a two-bits-per-cell memory array according to the invention.

FIG. 12 shows a memory array in which a plurality of cells are connected to each other via a common source or drain line as an example of higher integration. In the case of writing information to b0 to b7, by setting the even-numbered bit lines 0, 2, 4, 6, and 8 as sources (0V) and setting the odd-numbered bit lines 1, 3, 5, and 7 as drains (by applying a positive voltage), the writing is realized. The information can be written to b8 to b15 by interchanging the source and drain at the time of writing b0 to b7.

At the time of reading, in the unit memory array of two cells of FIG. 9, for reading the even-numbered addresses b0 to b7, the source voltage detecting method is used. Although the source voltage detecting method can be used also in FIG. 12, since neighboring cells are common, b0 to b7 cannot be read simultaneously.

Figure 13:
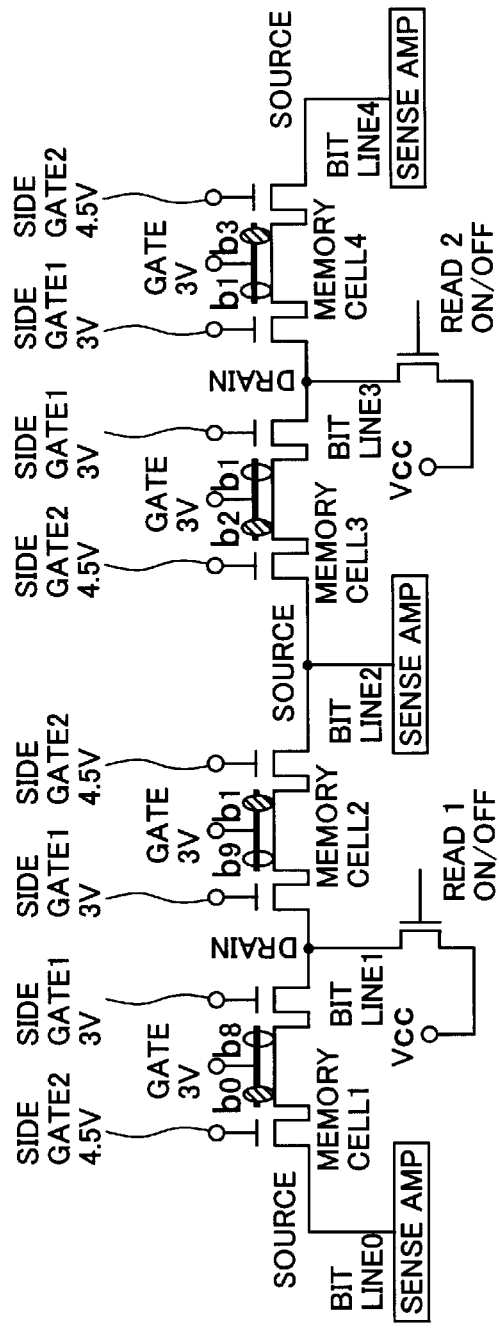
FIG. 13 is a diagram for explaining a reading method with the configuration of the two-bits-per-cell memory array according to the invention.
Figure 13:
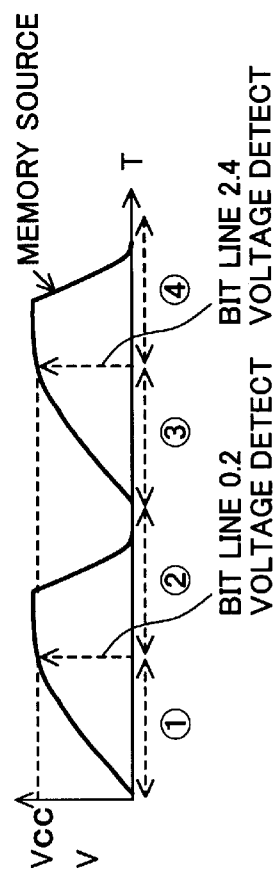

For example, as shown in FIG. 13, at the time of reading b0 to b7, the even-numbered bit lines are used as sources and made open. A positive voltage is applied to the odd-numbered bit lines and whether a positive voltage appears on the source or not is detected. However, for example, since the source line of b1 and b2 is commonly used, there is the possibility that the positive voltage appears simultaneously. In this case, whether b1 or b2 cannot be determined. In such a case, by detecting b1 and b2 with time shift, the detection can be realized. As shown in FIG. 13, in time ①, a bias is applied to memory cells 1 and 2 including b0 and b1 to turn on a read transistor 1 and voltages appearing on the bit lines 0 and 2 are detected by the sense amplifier. In such a manner, b0 and b1 can be detected. At this time, it is necessary to preliminarily stop biases to be applied on the memory cells 3 and 4 and turn off a read transistor 2. In time ②, considering that the source voltage has increased close to Vcc, charges accumulated on the source line are discharged. At this time, all of biases on the memory cells are stopped and the read transistors are turned off. The source voltage may be discharged by the sense amplifier or a discharge transistor or the like may be additionally provided for the source line. In time ③ and ④, the method of detecting b2 and b3 is shown. FIG. 13 shows the method of reading b0 to b3. With respect to b0 to b7, it is sufficient to detect a group of b0, b1, b4, and b5 in the time ① and ② and detect a group of b2, b3, b6, and b7 in the time ③ and ④. At the time of reading b8 to b15, they can be detected by the drain voltage detecting method while shifting time for the same reason as above.

FIG. 13 is a diagram showing the memory array in which one byte is simultaneously written/read. By arranging a plurality of memory cells in parallel, a plurality of bytes can be simultaneously read/written.

Figure 14:
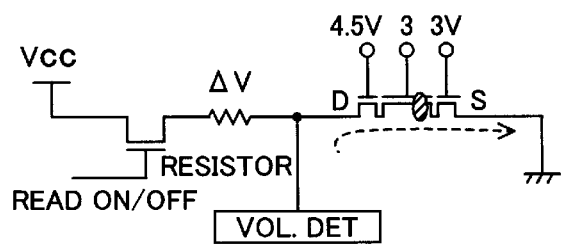
FIG. 14 is a diagram for explaining an improved drain voltage detecting method according to the invention.
Figure 14:
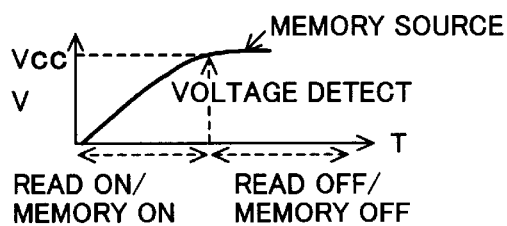
Figure 14:
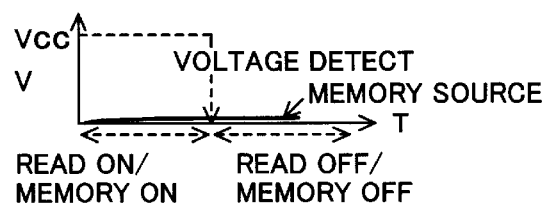

With respect to the drain voltage detecting method and the source voltage detecting method as the reading methods, as shown in FIGS. 10B and 10C, in the drain voltage detecting method, precharging is performed on the drain side and, on the other hand, in the source voltage detecting method, it is unnecessary to perform precharging. Consequently, detection times become different from each other. It can be said that the source voltage detecting method is a high-speed reading detection method requiring no precharging. In the case where two kinds of detecting methods of the drain detecting method and the source voltage detecting method are used, read time is determined by the drain detecting method which is a slower reading method. Consequently, as shown in FIG. 14, a high-speed reading method requiring no precharging in a manner similar to the source detecting method has been also devised as the drain detecting method. FIG. 14 shows a circuit in which a resistor is inserted between Vcc and a drain. Different from the conventional drain voltage detection, the read transistor is turned on and simultaneously the bias is applied to the memory cell, and a drain voltage is detected. Therefore, within the precharging period of the conventional drain voltage detecting method, data can be read.

For example, in a state where charges are injected to the source side of the memory cell, Vth of the memory cell is shifted to the positive side. Consequently, even when the read transistor is turned on and the bias is applied to the memory cell, the memory cell is not turned on and the drain voltage is around Vcc.

In the case where no charges are injected to the source side of the memory cell, Vth of the memory cell is shifted to the negative side. Consequently, when the read transistor is turned on and the memory cell bias is applied, the memory cell is turned on and a current flows. When the current is passed to the memory cell, a voltage drop of $\Delta V$ (=i×R) occurs in the resistor R, so that it is sufficient to detect the voltage (Vcc−$\Delta V$) on the drain side. Thus, high-speed reading can be achieved without precharging the drain.

In the improved drain voltage detecting method using no precharging, a current flows from Vcc via a resistor R. Consequently, there is the possibility that a current flows more than the conventional drain voltage detecting method depending on the detection time.

Figure 15:
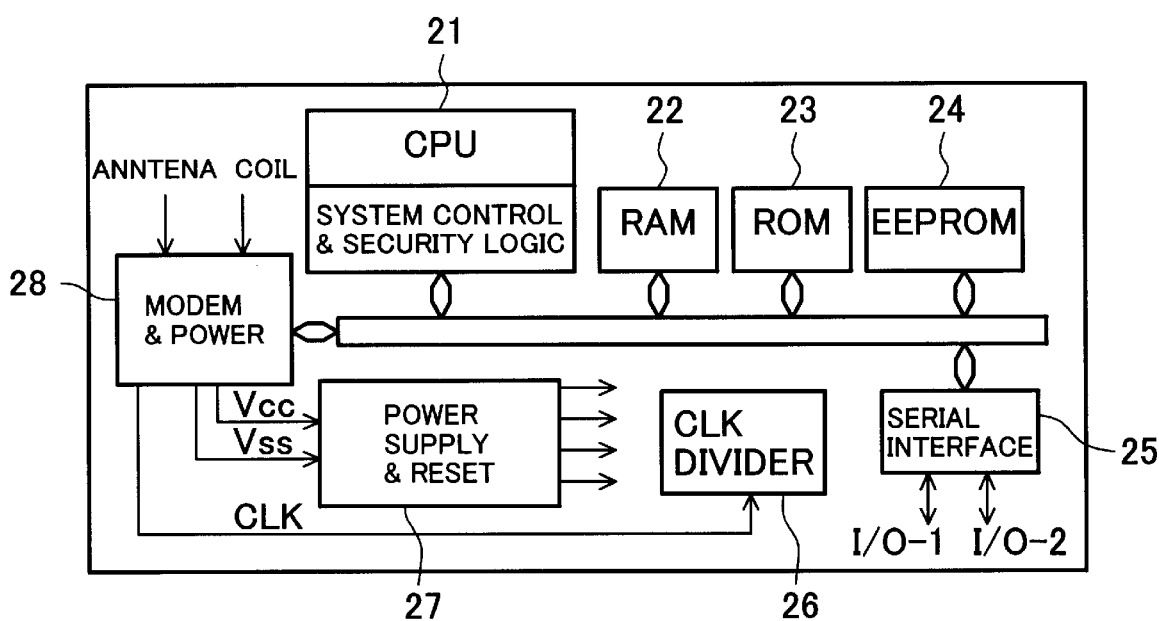
FIG. 15 is a block diagram showing a contact/contactless IC card.

By combining the reading methods, an optimum reading method according to use can be selected. For example, IC cards include a contact IC card and a contactless IC card. FIG. 15 is a block diagram of a contact/contactless IC card. The contact IC card can be obtained by eliminating the modem and power source 28 in FIG. 15. In a contact IC card system, data stored in the IC card can be read and data can be written into the IC card by a device called reader/writer. In this case, since power sources Vcc and Vss and a clock CLK are supplied directly from the reader/writer via lines, reduction in power consumption in the IC card is not particularly required, rather, high-speed data transmission is requested. In such a case, high-speed reading is demanded for memories of the RAM 22, ROM 23, and EEPROM 24. Consequently, in the case of using memory arrays of FIGS. 9 and 12 for the RAM, ROM, and EERPOM, by employing the source voltage detecting method and the improved drain voltage detecting method using no precharging of FIG. 14, high speed reading can be achieved. In the case of using the memory array of FIG. 7, it is sufficient to use either the source voltage detecting method or the drain voltage detecting method using no precharging of FIG. 13.

In the case of the contactless IC card, similarly, data of the IC card is read/written by the reader/writer. With respect to powers necessary for the IC card, clocks CLK, and data, an electromagnetic wave generated from the reader/writer is received by an antenna coil in the IC card and used as a power in the IC card. Consequently, the power supplied to the IC card largely varies according to a communication distance between the reader/writer and the IC card. Generally, in order to increase the communication distance as much as possible, it is necessary to reduce the power consumption of the IC card as much as possible. In such a case, when the memory arrays of FIGS. 9 and 12 are used for the RAM, ROM, and EEPROM, by employing the precharge type drain voltage detecting method of FIG. 10B and the source voltage detecting method, reading can be performed with low power consumption. In the case of using the memory array of FIG. 7, it is sufficient to use either the precharge type drain voltage detecting method or source voltage detecting method.

Recently, an IC card having both the function of the contact IC card and the function of the contactless IC card as shown in FIG. 15 is being used. The IC chip in the IC card realizes the functions of the contact and contactless functions by one chip. In such a case as well, by preparing the three kinds of memory reading methods of the source voltage detecting method, precharge type drain voltage detecting method, and drain voltage detecting method using no precharging and performing communications while switching the reading method in accordance with the type which is either the contact type or the contactless type, a high-speed communication type or a low power consumption type can be realized according to the use.

The invention provides a semiconductor memory which can store two bits per memory cell. At the time of reading or writing two bits by accessing a memory cell twice, by changing the bit arrangement in accordance with the reading or writing method, a plurality of bytes can be simultaneously read or written. An effect at shortening the read time or write time is produced.

The invention also provides the reading method enabling a memory to be read at higher speed. Consequently, in a system using the semiconductor memory, by properly combining the low power consumption type reading method and the high speed type reading method, a memory array according to use can be provided.

What is claimed is:

1. A non-volatile semiconductor memory device in which memory cells, each having a memory transistor storing information of two bits by using two edges of a dielectric layer positioned between a gate and a channel as two trapping storage regions, arranged in columns and rows in a matrix, comprising:

a plurality of word lines;

a plurality of first bit lines; and a plurality of second bit lines, wherein the memory transistors of the memory cells in each row have gates connected to an associated word line, the memory transistors of the memory cells in each column have first diffusion regions connected to an associated first bit line and second diffusion regions connected to an associated second bit line, the memory cells in an m-th column (m: odd number) and the memory cells of an (m+1)th column are connected to a same second bit line, a sense amplifier which detects a voltage is connected to said first bit line, information of a bit stored at the edge of said dielectric layer on said second bit line side is read by using said second bit line as a source, using said first bit line as a drain, and detecting a drain voltage, and information of a bit stored at the edge of said dielectric layer on said first bit line side is read by using said second bit line as a drain, using said first bit line as a source, and detecting a source voltage.

2. The non-volatile semiconductor memory device according to claim 1, wherein said first bit line is precharged before detection of said drain voltage, and said second bit line is not precharged before detection of said source voltage.

3. The non-volatile semiconductor memory device according to claim 1, further comprising a resistor of which one end is connected to a fixed potential and another end is connected to said first bit line, thereby making precharging of said first bit line before detection of said drain voltage and precharging of said second bit line before detection of said source voltage unnecessary.

* * * * *